(12) United States Patent
Lim et al.

(10) Patent No.: US 11,755,437 B2
(45) Date of Patent: Sep. 12, 2023

(54) GAS SUPPLY SYSTEM

(71) Applicant: VERSUM MATERIALS US, LLC, Tempe, AZ (US)

(72) Inventors: Tae-Jun Lim, Seoul (KR); Jihoon Kim, Gyeonggi-do (KR); Tae-Ug Kang, Incheon (KR)

(73) Assignee: Versum Materials US, LLC, Tempe, AZ (US)

( * ) Notice: Subject to any disclaimer, the term of this patent is extended or adjusted under 35 U.S.C. 154(b) by 664 days.

(21) Appl. No.: 16/622,415

(22) PCT Filed: Jun. 15, 2018

(86) PCT No.: PCT/US2018/037834
§ 371 (c)(1),
(2) Date: Dec. 13, 2019

(87) PCT Pub. No.: WO2018/232292
PCT Pub. Date: Dec. 20, 2018

(65) Prior Publication Data
US 2020/0208783 A1 Jul. 2, 2020

(30) Foreign Application Priority Data
Jun. 15, 2017 (KR) .................. 10-2017-0075558

(51) Int. Cl.
*G06F 11/20* (2006.01)
*F17C 13/00* (2006.01)
(Continued)

(52) U.S. Cl.
CPC ........ *G06F 11/2092* (2013.01); *F17C 13/002* (2013.01); *F17C 13/023* (2013.01);
(Continued)

(58) Field of Classification Search
CPC ............ G05B 19/0425; G05B 23/0286; F16C 13/025; F16C 2205/0326;
(Continued)

(56) References Cited

U.S. PATENT DOCUMENTS 5,516,366 A * 5/1996 Kanno .................... C23C 16/52
118/715
5,583,796 A * 12/1996 Reese .............. G08B 13/19645
348/E7.086

(Continued)

FOREIGN PATENT DOCUMENTS

CN 103149907 A 6/2013
CN 105390363 A 3/2016
(Continued)

OTHER PUBLICATIONS

US International Search Report and Written Opinion of the International Searching Authority, dated Sep. 7, 2018, for PCT/US18/37834.

*Primary Examiner* — Atif H Chaudry
(74) *Attorney, Agent, or Firm* — Daniel A. DeMarah, Jr.

(57) ABSTRACT

The gas supply system of this invention is furnished with a cylinder apparatus having a pneumatic valve that supplies process gas to a process chamber, and a solenoid valve that opens or closes said pneumatic valve by supplying or stopping the flow of valve actuating gas to said pneumatic valve; and a gas supply control apparatus that controls the actuation of the solenoid valve. In addition, said gas supply control apparatus comprises a main controller that controls the actuation of said solenoid valve during normal operation, and a sub-controller that senses an abnormal state of said main controller and if an abnormality is sensed, controls the actuation of said solenoid valve instead of said main controller.

13 Claims, 4 Drawing Sheets

(51) Int. Cl.
*F17C 13/02* (2006.01)
*F17C 13/04* (2006.01)
*F17C 13/12* (2006.01)
*G05B 19/042* (2006.01)
*G05B 23/02* (2006.01)

(52) U.S. Cl.
CPC .......... *F17C 13/025* (2013.01); *F17C 13/026* (2013.01); *F17C 13/04* (2013.01); *F17C 13/123* (2013.01); *G05B 19/0425* (2013.01); *G05B 23/0286* (2013.01); *G06F 11/2089* (2013.01); *F17C 2201/032* (2013.01); *F17C 2205/0326* (2013.01); *F17C 2205/0388* (2013.01); *F17C 2223/0123* (2013.01); *F17C 2223/033* (2013.01); *F17C 2227/0304* (2013.01); *F17C 2227/0383* (2013.01); *F17C 2250/03* (2013.01); *F17C 2250/043* (2013.01); *F17C 2250/0421* (2013.01); *F17C 2250/0439* (2013.01); *F17C 2250/0491* (2013.01); *F17C 2250/0636* (2013.01); *F17C 2270/0518* (2013.01)

(58) Field of Classification Search
CPC ...... F16C 2205/0388; F16C 2223/0123; F16C 2227/0304; F16C 2250/03; F16C 2250/0421; F16C 2250/043; F16C 2250/0439; F16C 2250/0636; G06F 11/2092; G06F 11/2089
See application file for complete search history.

(56) References Cited

U.S. PATENT DOCUMENTS

| | | | |
|---|---|---|---|
| 6,577,988 | B1 | 6/2003 | Travagline et al. |
| 7,385,681 | B2 | 6/2008 | Ninomiya et al. |
| 8,117,851 | B2 | 2/2012 | Sugawara |
| 2002/0124575 | A1* | 9/2002 | Pant .................. F17C 9/02 62/50.1 |
| 2006/0021573 | A1 | 2/2006 | Monsma et al. |
| 2006/0271810 | A1 | 11/2006 | Hsu et al. |
| 2010/0224264 | A1 | 9/2010 | Homan et al. |
| 2013/0075636 | A1 | 3/2013 | Smith et al. |
| 2014/0358300 | A1* | 12/2014 | Yang .................. F17C 13/084 700/282 |
| 2015/0000785 | A1 | 1/2015 | Shin et al. |
| 2015/0260565 | A1 | 9/2015 | Smirnov et al. |
| 2017/0327950 | A1 | 11/2017 | Humfeld et al. |

FOREIGN PATENT DOCUMENTS

| | | | |
|---|---|---|---|
| KR | 20120084082 A | * | 7/2012 |
| WO | 2011/112413 A1 | | 9/2011 |

* cited by examiner

GAS SUPPLY SYSTEM

FIELD OF THE INVENTION

This application claims priority to KR Application Number: 10-2017-0075558 filed Jun. 15, 2017 which is incorporated herein by reference.

TECHNICAL FIELD

This invention relates to a gas supply system and method for supplying a process gas to a semiconductor facility.

BACKGROUND

In general, semiconductors are manufactured by repeatedly carrying out many processes, including photolithography, etching, and thin film formation. Most such manufacturing processes are carried out by means of process gases inside a closed process chamber. To this end, gas supply apparatuses are used in various industrial facilities such as semiconductor manufacturing equipment.

The gas supply system comprises a storage tank, which may be a cylinder, in which a high-pressure gas is stored, a gas supply control apparatus connected to the storage tank by a connecting pipe, and a gas supply control apparatus that controls the flow of gas flowing from the storage tank so as to supply the gas via the process line.

The gas supply control apparatus may control the process gas flowing into the process chamber by opening and closing an pneumatic valve. The pneumatic valve in this case may be turned on (open)/off (closed) by a solenoid valve.

In the semiconductor manufacturing process, a continuous supply of gas is crucial. If a problem (i.e. a fault in the control apparatus) arises such as an abnormal state of the gas supply control apparatus, e.g. main power interruption causing a solenoid valve malfunction, then a process defect may occur due to the abrupt interruption of process gas supply when the pneumatic valve is closed.

KR Patent No. 10-0347227 filed by the present applicant has proposed a method of keeping the valve in an open state by sensing a fault of the control apparatus and generating a separate process signal, in order to avoid the sudden stoppage of gas supply as described above.

However, in said patent, although the pneumatic valve may be kept open when a fault is sensed in the control apparatus, it is not possible to actuate a heater that is able to prevent liquifying of the process gas. In addition, said patent has the drawback that the pressure of the process gas and the weight of the cylinder, etc., cannot be known, because an analog signal cannot be received.

In addition, in said patent, when a fault occurs in the control apparatus, communication between the gas supply control apparatus and the central control room becomes impossible. As a result, gas monitoring by the central control room becomes impossible, and it becomes impossible for the central control room to know the accurate state of the gas supply system.

SUMMARY OF INVENTION

Accordingly, inasmuch as this invention has been devised in order to resolve the above-described problems in the prior art, an objective of this invention is to provide a gas supply system that controls gas supply so that it is not interrupted even when there is a fault in the control apparatus; senses the process gas pressure and cylinder weight, etc.; and enables a heater to be actuated and controlled.

Another objective of this invention is to provide a gas supply system such that, when a fault is sensed in the control apparatus, the pressure, weight and heater information is transmitted to the gas monitoring system so that the condition of the gas supply apparatus may be known accurately.

To achieve the above objectives, the gas supply system of this invention is furnished with a cylinder apparatus having one or more pneumatic valves located in a supply line fluidly connecting the storage tank or cylinder to the process chamber that controls the supply of process gas to a process chamber or one or more process chambers, and a solenoid valve (or one or more solenoid valves) that opens or closes said pneumatic valve (or one or more pneumatic valves respectively) by supplying or stopping the flow of valve actuating gas to each of said pneumatic valves (or one or more pneumatic valves); and with a gas supply control apparatus that controls the actuation of the solenoid valve (or one or more solenoid valves). In addition, said gas supply control apparatus comprises a main controller that controls the actuation of the solenoid valve (or one or more solenoid valves) during normal operation, and a sub-controller that senses an abnormal state of said main controller, and upon sensing an abnormality, controls the actuation of said solenoid valve (or one or more solenoid valves) instead of the main controller. Said main controller and sub-controller here share digital sensing information through digital interfacing, and/or said main controller and sub-controller share analog sensing information through analog interfacing.

In the gas supply system of this invention, said digital sensing information may comprise one or more of the following: flame sensing information that is input from said flame sensing optical sensor, high-temperature sensing information that is input from said high-temperature sensor, and gas leakage sensing information that is input from the gas leakage sensor; said flame sensing optical sensor, high temperature sensor, and gas leakage sensor are mounted in the cylinder apparatus. (The term "high-temperature sensor" is used to differentiate from an additional type or types of temperature sensors that measure the temperature of the process gas or the heaters that may be used in the cylinder apparatus, although the types of sensors may be the same or different.)

In the gas supply system of this invention, said main controller controls the actuation of the heater (or one or more heaters) to prevent liquifying of the process gas based on the heating temperature sensing information from an additional one or more temperature sensors referred to as a "process gas temperature sensors" during normal operation, and when said abnormality sensing occurs, said sub-controller controls the actuation of the heater (or one or more heaters) based on the heating temperature sensing information from the one or more process gas temperature sensors, in order to prevent liquifying of the process gas.

In one embodiment of the gas supply system of this invention, said analog sensing information may comprise one or more or two or more of the following: gas supply pressure sensing information that is input from a pressure sensor (or one or more pressure sensors), cylinder weight sensing information that is input from a weight sensor (or one or more weight sensors) and process gas temperature sensing information that is input from one or more process gas temperature sensors; said pressure sensor (or one or more pressure sensors) and weight sensor (or one or more weight sensors) are mounted in the cylinder apparatus.

In alternative embodiments, all or some of the above-listed sensors may be analog or all or some of the above-listed sensors may be digital in any combination. For example, in an alternative embodiment, the one or more weight sensors, the one or more process gas temperature sensors and the one or more pressure sensors may be digital and/or the one or more flame sensing optical sensors, the one or more high temperature sensors, and the one or more gas leakage sensors may be analog. Alternatively, a mix of analog and digital pressure sensors, a mix of analog and digital weight sensors, and a mix of analog and digital temperature sensors, and the like for the other types of sensors, may be used, if desired.

In the gas supply system of this invention, said gas supply control apparatus further comprises: a monitoring system that selectively communicates with said main controller and sub-controller to continuously monitor the process gas supply status, and a changeover switch that, in normal operation, interconnects said main controller and monitoring system via said communication line, and when an abnormality is detected, interconnects said sub-controller and monitoring system via said communication line.

This invention also provides a method of using the gas supply system of the invention to perform the following steps: sharing digital or analog or digital and analog sensing information through digital or analog or digital and analog interfacing between said main controller and said sub-controller; and switching control of said gas supply system to said sub-controller that senses an abnormal state of said main controller; wherein the sub-controller controls the actuation of said one or more solenoid valves instead of the main controller. The method may further comprise the step of maintaining the valve position of the one or more solenoid valves upon switching the control to the sub-controller.

This invention has the advantages that gas supply is controlled so that it is not interrupted even when the control apparatus is in a fault condition; the process gas pressure and cylinder weight, etc., are sensed; and a heater (or one or more heaters) may be operated and controlled.

This invention has the advantage that, when a fault is detected in the control apparatus, pressure, weight and heater information and/or temperature information are transmitted to the gas monitoring system so that the condition of the gas supply apparatus may be known accurately, controlled and continue to supply process gas, or the system may be shut down under the control of the sub-controller if the sensing information indicates an unsafe level for any of the sensing information communicated to the sub-controller.

DETAILED DESCRIPTION

Hereinbelow, preferred embodiments of this invention will be described in detail, with reference to the accompanying drawings.

Figure 1:
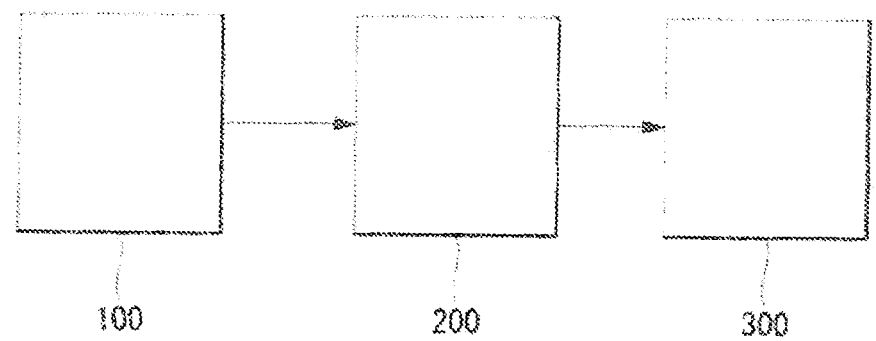
FIG. 1 illustrates a schematic configuration of a gas supply system according to this invention.

FIG. 1 illustrates a schematic configuration of a gas supply system according to this invention.

Figure 2:
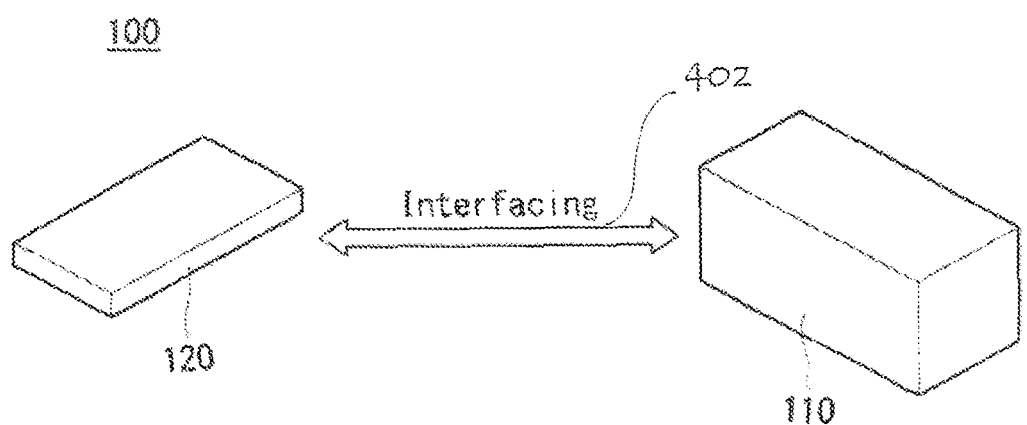
FIG. 2 illustrates schematically the internal configuration of the gas supply control apparatus of FIG. 1.
Figure 6:
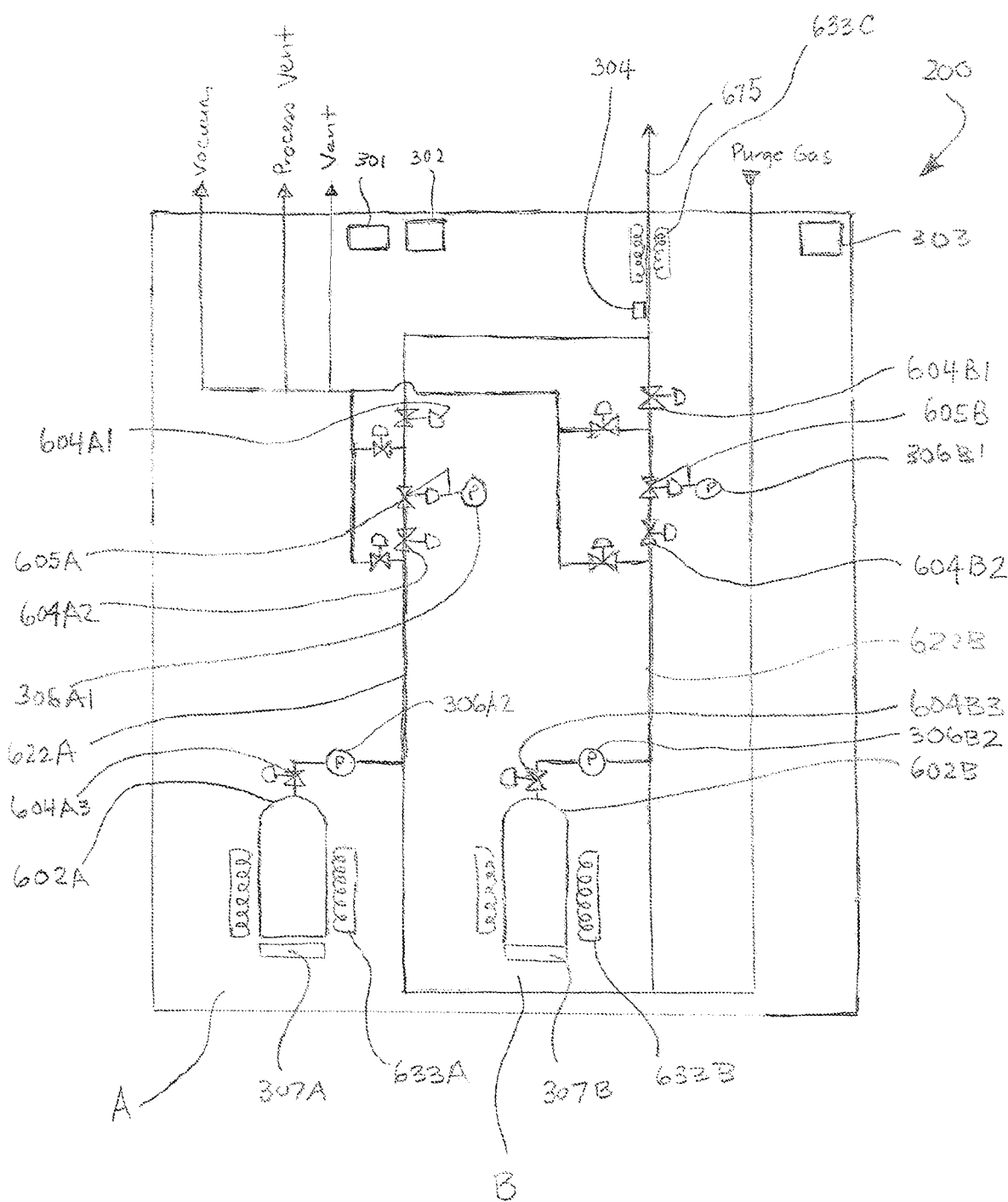
FIG. 6 illustrates schematically one embodiment of a cylinder apparatus of this invention.

Referring to FIG. 1, a gas supply system according to this invention comprises a gas supply control apparatus 100 and a cylinder apparatus 200. FIG. 2 shows an illustration of one embodiment of a gas control apparatus 100. FIG. 6 shows an illustration of a cylinder apparatus 200. Note, some aspects of a cylinder apparatus are not shown, nor described herein.

The cylinder apparatus 200 supplies process gas to one or more process chambers 300. The cylinder apparatus 200 has one or a plurality of gas cylinders that store process gases. In one embodiment, as shown in FIG. 6, the cylinder apparatus 200 alternately operates 2 gas cylinders 602A, 602B to supply process gas to the process chamber 300 via pipe 675. By alternating means that the A side operates with process gas supplied by cylinder 602A while the B side cylinder 602B is not operational. Once the A side cylinder 602A is empty, the B side of the cylinder apparatus 200 operates and the A side is not operational. If the sub-controller 120 takes over control, it knows which cylinder 602A or 602B, and solenoid valves and pneumatic valves were operating when it takes over and sub-controller 120 continues to operate the cylinder apparatus 200 on that side A or B of the cylinder apparatus 200. It is understood in the description below that the process gas flows through either the A side or the B side of the cylinder apparatus 200. The elements with an A designation are used when gas is flowing on the A side. Alternatively, the elements with a B designation are used when gas is flowing on the B side. Both side A and side B include pipe 675 and other elements without either an A or B designation. The process chamber 300 uses process gas to treat the semiconductor substrate through a semiconductor fabrication process.

The cylinder apparatus 200 adjusts the process gas stored in the gas cylinder to a specified pressure and flow rate (though optional regulators 605A, 605B) corresponding to the process recipe, and supplies the process gas to the process chamber 300. To this end, the cylinder apparatus 200 may be furnished with one or more or a plurality of pneumatic valves 604A1, 604A2, 604A3, 604B1, 604B2 and 604B3 each controlled by a solenoid valve (not shown) connected to a pressurized gas source (not shown). The pneumatic valves 604A1, 604A2, 604A3, 604B1, 604B2 and 604B3 control the supply of process gas to the process chamber 300 through either pipes 622A or 622B connected to each cylinder 602A and 602B respectively and pipe 675 connected to pipes 622A and 622B. Pipe 675, as shown, exits the cylinder apparatus and transports the process gas to process chamber 300. Each of the solenoid valves in fluid communication with the pressurized gas source serve to open or close the respective pneumatic valves by supplying or blocking the supply of valve actuating gas to the pneumatic valves. The actuating gas is typically pressurized air (clean dry air) supplied via a pipe (not shown) connected from a manufacturing facility's (house) pressurized air supply (not shown); however, alternative gases, for example, pressurized nitrogen, may be used.

The cylinder apparatus 200 may be furnished with a power supply unit located in the main controller 100 that supplies main power, and a plurality of sensors located in the cylinder apparatus 200. The sensors comprise a plurality of (one or more) pressure sensors 306A1, and 306B1 that measure the pressure of process gas in lines 622A and 622B respectively downstream of regulators 605A and 605B respectively and/or the pressure sensors 306A2 and 306B2 that measures the pressure of the process gas at the cylinders 602A and 602B respectively, and a plurality of (one or more) weight sensors 307A, 307B that measure the weight of the gas cylinders 602A and 602B respectively. In addition, the sensors comprise a flame sensing optical sensor 301 that senses flame (UVIR), a gas leakage sensor 303 that senses gas leakage, and a high temperature sensor 302. The high temperature sensor senses an abnormal temperature inside the system; if a specified temperature is reached, it supplies an alarm signal to the gas supply control apparatus 100. The high temperature sensor may actuate in case of fire, if a specific preset temperature (e.g., 85 degrees C.) is reached or exceeded. The flame sensor, gas leakage sensor and temperature sensor will also send an alarm if activated and/or cause the gas supply apparatus to shut down. In addition, said sensors may further comprise an EMO sensor (not shown) that senses the pressing of an emergency button in order to externally notify of an emergency situation, and a power sensor (not shown) that senses the main power supply state. In one embodiment, the power sensor is via the interface between the sub-controller and the main controller. If the main controller loses power, the sub-controller detects the loss of power when the main controller loses power (and turns off). When the main controller loses power, the sub-controller takes over the control, even if only limited control, of the cylinder apparatus.

The gas supply control apparatus 100 monitors the operation state of the cylinder apparatus 200 in real time, in combination with said sensors, and if the main power is interrupted, it controls the operation of the cylinder apparatus 200 so that process gas is supplied consistently until the process currently under way in the process chamber 300 is completed. For example, the gas supply control apparatus 100 uses the sub-controller to supply power to the sensors of the cylinder apparatus 200 until the process currently under way in the process chamber 300 is completed by continuing to supply process gas to the process chamber 300 via the one or more pneumatic valves by controlling the operation of the one or more solenoid valves that when open supply pressurized air to open the corresponding pneumatic valves. The pressurized air, when supplied opens the pneumatic valve. Preferably, the process conditions and amount of process gas to supply to the process chamber for the process for which the main power was interrupted were programed into the gas control apparatus prior to starting the process. The process will continue under the control of the sub-controller until the pre-programmed amount of process gas is supplied to the process chamber. If the main controller is still not functioning upon completion of the process, the sub-controller may sound an alarm and shut down the cylinder apparatus.

FIG. 2 illustrates the internal configuration of the gas supply control apparatus of FIG. 1.

Referring to FIG. 2, the gas supply control apparatus 100 comprises a main controller 110 that operates in the normal state, and a sub-controller 120 that operates in the abnormal state and digital and/or analog interfacing 402.

The main controller 110 controls the independent actuation of one or more of the solenoid valve(s) S604A1, S604A2, S604A3, S604B1, S604B2, S604B3 (not shown in FIG. 6, shown in FIG. 7) that control each of the respective one or more pneumatic valves shown in FIG. 6 as 604A1, 604A2, 604A3, 604B1, 604B2, 604B3 during normal operation.

The sub-controller 120 senses an abnormal state of the main controller, and when an abnormality is sensed, it controls the actuation of one or more of the solenoid valves that control the flow of the actuating gas to the one or more pneumatic valves shown in FIG. 6 as 604A1, 604A2, 604A3, 604B1, 604B2, 604B3 instead of the main controller 110.

Figure 3:
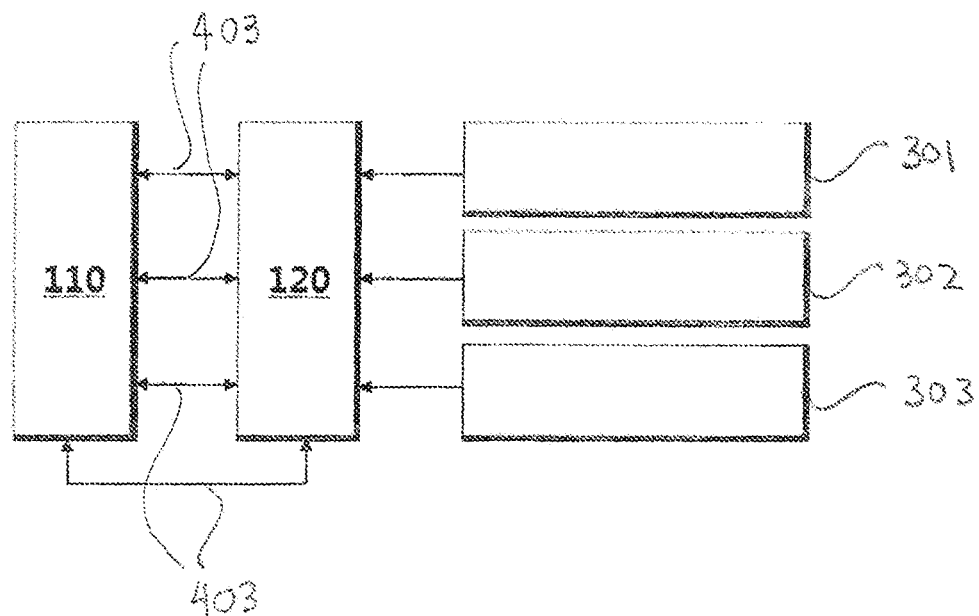
FIG. 3 illustrates schematically the interconnection of the main controller and sub-controller through digital interfacing.
Figure 4:
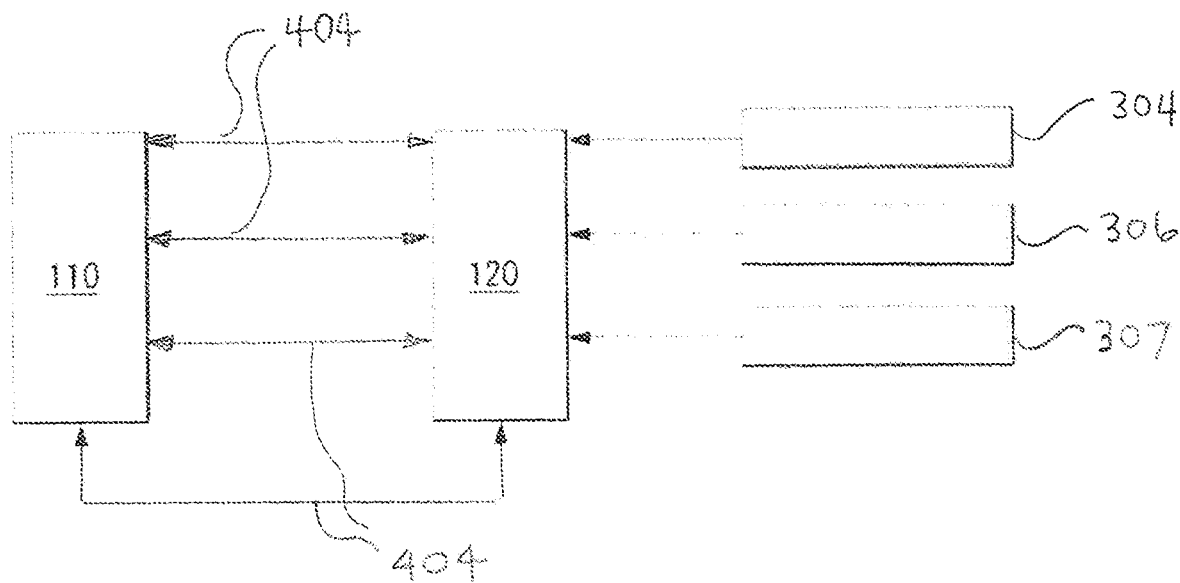
FIG. 4 illustrates schematically the interconnection of the main controller and sub-controller through analog interfacing.

The main controller 110 and the sub-controller 120 mutually share digital sensing information through digital interfacing 403 as shown in FIG. 3 and share analog sensing information through analog interfacing 404 shown in FIG. 4.

For example, the PLC (Programmable Logic Controller) digital output of the main controller 110, and the digital input of the sub-controller 120, may be shared through digital interfacing 403. In this case, the sub-controller 120 may control the actuation of the one or more solenoid valves that control the flow of the actuating gas to the respective pneumatic valves 604A1, 604A2, 604A3, 604B1, 604B2, 604B3 when an abnormality is sensed in the main controller 110, thus avoiding the interruption of the supply of process gas to the process chamber 300. Whatever position (open or closed) each solenoid valve was in when the apparatus was controlled by the main controller 110 at the time the abnormality was sensed, each solenoid valve will keep that position (open or closed) under the sub-controller's control until the process that was underway is completed.

As an additional example, the PLC (Programmable Logic Controller) digital input, and the digital output of the sub-controller 120, may be shared through digital interfacing 403. In this case, when an abnormality is sensed in the main controller 110, the process gas may continue to be normally supplied to the process chamber 300, because of the sub-controller 120 controlling the actuation of the one or more solenoid valves (not shown) that control the pneumatic valves 604A1, 604A2, 604A3, 604B1, 604B2, 604B3 (as shown in FIG. 6) in place of the main controller 110. In addition, when an abnormality of the main controller 110 is sensed, the sub-controller 120 instead of the main controller 110 monitors the heating temperature measured by temperature sensor 304 that controls the actuation of the one or more heaters 633A, 633B, 633C located in contact with each of the cylinders 602A, 602B and/or in contact with the pipe downstream of the one or more cylinders preferably near where the supply pipe 675 exits the cylinder apparatus 200 to the process chamber 300, thereby preventing the process gas from liquefying. The heater 633C in contact with the pipe 675 and/or the heater 633A or 633B in contact with the cylinder that is supplying gas is actuated, if needed.

The main controller 110 and sub-controller 120 mutually share analog sensing information through analog interfacing. For example, upon sensing an abnormality in the main controller 110, the sub-controller 120 may continuously monitor one or more of the following: the temperature from process gas temperature sensor 304, and/or the gas supply pressure from one or more pressure sensors 306A1, 306A2, 306B1, 306B2 (shown only as 306 in FIG. 4), and/or cylinder weight from 307A or 307B (shown only as 307 in FIG. 4), etc., instead of the main controller 110. Note although only one process gas temperature sensor 304 is shown in FIG. 6, additional temperature sensors may optionally be provided that communicate with the main controller and sub-controller like temperature sensor 304 in the cylinder apparatus 200. Additional temperature sensors may be located on lines 622A or 622B and/or on the cylinders 602A, 602B.

FIG. 3 illustrates the interconnection of the main controller and sub-controller through digital interfacing 403.

Referring to FIG. 3, the main controller 110 and the sub-controller 120 may share digital sensing information as a result of being interconnected through digital interfacing 403.

The digital sensing information may comprise flame sensing information that is input from a flame sensing optical sensor 301, high-temperature sensing information that is input from a high-temperature sensor 302, and gas leakage sensing information that is input from a gas leakage sensor 303. The flame sensing optical sensor 301, high temperature sensor 302, and gas leakage sensor 303 may be mounted in the cylinder apparatus 200 shown schematically in the embodiment in FIG. 6. Each of the sensors may detect a preprogrammed unsafe level that would cause the cylinder apparatus to sound an alarm and/or shut down.

The main controller 110, in normal operation, may control the actuation of one or more of the heaters 633A, 633B, 633C based on temperature sensing information from one or more temperature sensors, such as 304, in order to prevent liquifying of the process gas. In addition, when an abnormality is detected, the sub-controller 120 may control the actuation of the one or more heaters 633A, 633B, 633C based on the heating temperature sensing information from one or more temperature sensors, such as 304, in order to prevent liquifying of the process gas.

FIG. 4 illustrates the interconnection of the main controller and sub-controller through analog interfacing.

Referring to FIG. 4, the main controller 110 and the sub-controller 120 may share analog sensing information as a result of being interconnected through analog interfacing.

The analog sensing information may comprise gas supply pressure sensing information that is input from one or more temperature sensors 304, one or more pressure sensors 306A1, 306A2, 306B1, 306B2, and cylinder weight sensing information that is input from one or more weight sensors 307A, 307B. The pressure sensors and weight sensors in this case may be mounted in the cylinder apparatus as shown in FIG. 6.

Figure 5:
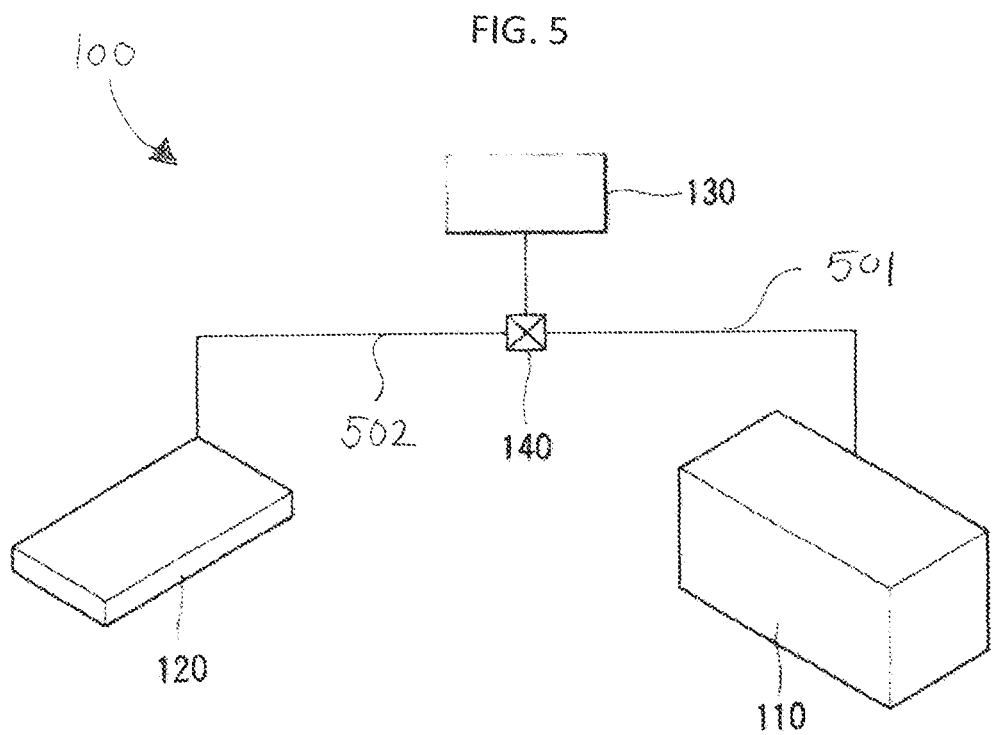
FIG. 5 illustrates schematically the configuration of the connection between the main controller and sub-controller of the gas supply control apparatus and the gas monitoring system.

FIG. 5 illustrates the configuration of the connection between the main controller 110 and the sub-controller 120 of the gas supply control apparatus and the gas monitoring system 130.

Referring to FIG. 5, the gas supply control apparatus 100 according to this invention may further comprise a monitoring system 130 and a changeover switch 140. Accordingly, in the gas supply control apparatus 100 according to this invention, when an abnormal state occurs in the main controller 110, the sub-controller 120 connected to the communication line 502 operates instead, so that the cylinder apparatus continues to supply process gas, the monitoring system 130 may continuously monitor the gas supply status, and via the sub-controller or main controller control the one or more heaters 633A, 633B, 633C in the cylinder apparatus 200 based on pressure (measured by the one or more pressure sensors 306A1, 306A2 or 306B1, 306B2) and weight of the cylinder (measured by the one or more weight sensors 307A or 307B) and maintain the valve position (open or closed) of the solenoid valves which maintains the positions of the respective pneumatic valves. The "gas supply status" or the "process gas supply status" refers to the actual measured temperature and pressure from the sensors in the cylinder apparatus 200 and optionally the amount of the process gas flowing into and already provided into the process chamber (the amount can be determined by time and flow rate and/or change in weight of the cylinder.) The process gas supplied status can be compared to the pre-programmed temperature, and/or pressure, and/or flow rates and the amount supplied can be determined thereby and/or by the change in the weight and/or time for the process gas to flow to the process chamber 300 for a particular process and the gas supply apparatus can be controlled based on that information. In alternative embodiments, the apparatus continues the flow until it is manually shut down by a technician or the main controller resumes control.

Specifically, the monitoring system 130 selectively communicates with the main controller 110 and the sub-controller 120 to continuously monitor the process gas supply status. In other words, in normal operation, the monitoring system 130 communicates with the main controller 110 via electrical communication line 501 to continuously monitor the process gas supply status; but in abnormal operation, it communicates with the sub-controller 120 via electrical communication line 502 to continuously monitor the process gas supply status.

In normal operation, the changeover switch 140 interconnects the main controller 110 and monitoring system 130, via a communication line 501. In contrast, in abnormal operation, the changeover switch 140 interconnects the sub-controller 120 and the monitoring system 130, via a communication line 502.

Figure 7:
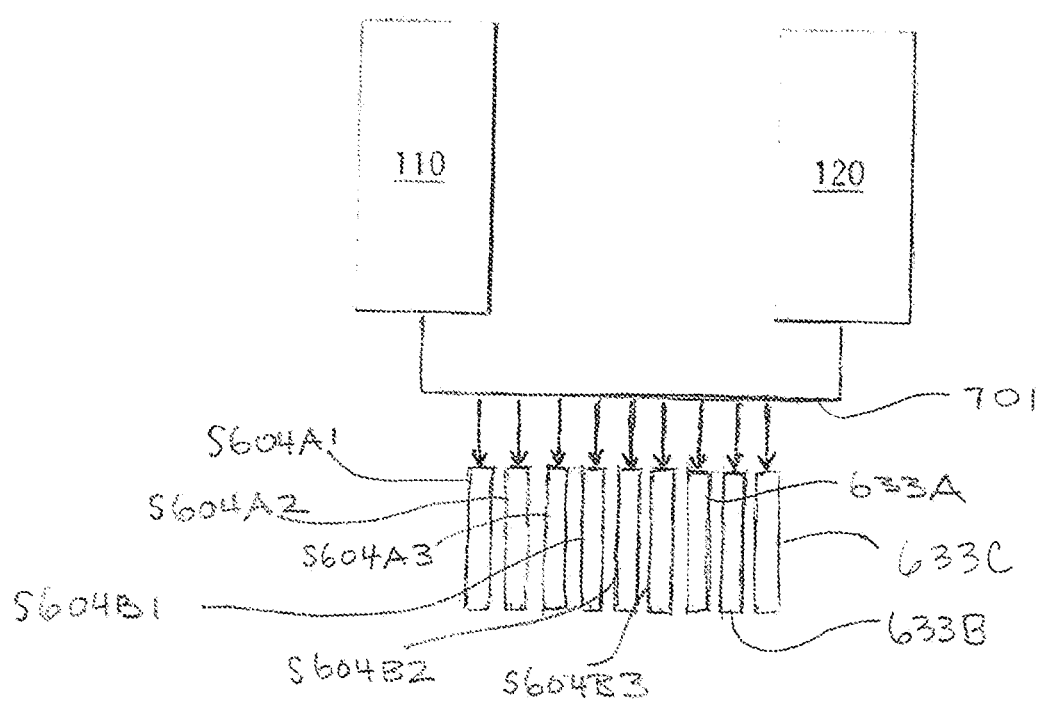
FIG. 7 illustrates schematically the configuration of the connection between the main controller and sub-controller of the gas supply control apparatus and the solenoid valve(s) and the heater(s).

FIG. 7 shows in one embodiment, the interconnected communication via an electrical connection 701 between the main controller 110 and the sub-controller 120 with the solenoid valve(s) 5604A1, 5604A2, 5604A3 or 5604B1, 5604B2, 5604B3 and the heaters 633C and 633A or 633C and 633B, and to maintain the process gas supply status until the pre-programmed process is completed or shut down or the main controller resumes control. Each of the solenoid valves control the respective pneumatic valves 604A1, 604A2, 604A3, 604B1, 604B2, 604B3.

This invention has the following effects.

First, process failures due to the interrupted flow of process gas may be prevented from the outset, because the process gas supply may be continuously controlled by the sub-controller, even when the main controller malfunctions.

Second, this invention has the advantage that the gas pressure, and/or the temperature of the process gas and/or the weight of the cylinder, etc., may monitored and the one or more heaters may be operated and controlled even when the main controller malfunctions.

Third, according to this invention, it is possible to continuously monitor one or more the following: the pressure, the temperature of the process gas, weight, heater information, etc., without a communication failure occurring even when there is a main controller malfunction, by switching to a gas monitoring system monitored from the central control room by electrical communication between the monitoring system and the control room (not shown); thus, it has the advantage that the condition of the gas supply system may be known with precision.

From the above description, it will be understood by those skilled in the art that the invention may be modified and adapted in diverse ways, without changing the technical idea or essential features of the invention. Therefore, the technical scope of this invention should not be limited to the contents described in the detailed description of the specification, but should be defined by the claims.

We claim:
1. A gas supply system, comprising:
a cylinder apparatus having one or more pneumatic valves that controls the supply of process gas to a process chamber, and one or more solenoid valves that opens or closes said pneumatic valve by supplying or stopping the flow of valve actuating gas to said pneumatic valve; and
a gas supply control apparatus that controls the operation of the one or more solenoid valves;
wherein said gas supply control apparatus comprises:
a main controller that controls the actuation of the one or more solenoid valves during normal operation;
a sub-controller that senses an abnormal state of said main controller and upon sensing an abnormality, controls the actuation of said one or more solenoid valves instead of the main controller;
wherein said main controller and said sub-controller share digital sensing information through digital interfacing directly with each other, and the main controller and the sub-controller additionally share analog sensing information through analog interfacing directly with each other;
a monitoring system and a communication line;
wherein said monitoring system selectively communicates with said main controller and sub-controller to continuously monitor the process gas supply status; and
a changeover switch for interconnecting the main controller with the monitoring system through the communication line in the normal state and for interconnecting the sub-controller and the monitoring system through the communication line when the abnormality is detected, separately from the digital and analog interfacing between the main controller and the sub-controller.

2. The gas supply system according to claim 1, wherein said digital sensing information comprises at least one selected from the group consisting of:
flame sensing information that is input from a flame sensing optical sensor, high-temperature sensing information that is input from a high-temperature sensor, and gas leakage sensing information that is input from a gas leakage sensor;
wherein said flame sensing optical sensor, said high temperature sensor, and said gas leakage sensor are mounted in the cylinder apparatus.

3. The gas supply system according to any of claim 1, wherein said analog sensing information comprises at least one selected from the group consisting of:
gas supply pressure sensing information that is input from one or more pressure sensors, cylinder weight sensing information that is input from one or more weight sensors, and process gas temperature information that is input from one or more process gas temperature sensors; and
wherein said one or more pressure sensors, and one or more temperature sensors and one or more weight sensors, if present, are mounted in the cylinder apparatus.

4. The gas supply system according to claim 1, wherein said cylinder apparatus further comprises one or more heaters and one or more process gas temperature sensors and said main controller controls the actuation of the one or more heaters to prevent liquifying of the process gas based on the heating temperature sensing information from said one or more process gas temperature sensors, and wherein when said abnormality sensing occurs, said sub-controller controls actuation of the one or more heaters based on said heating temperature sensing information, in order to prevent liquefying of the process gas.

5. The gas supply system according to claim 1, wherein said digital sensing information comprises at least two selected from the group consisting of:
flame sensing information that is input from a flame sensing optical sensor, high-temperature sensing information that is input from a high-temperature sensor, and gas leakage sensing information that is input from a gas leakage sensor.

6. The gas supply system according to claim 1, wherein said analog sensing information comprises at least two selected from the group consisting of:
gas supply pressure sensing information that is input from one or more pressure sensors, cylinder weight sensing information that is input from one or more weight sensors, and process gas temperature information that is input from one or more process gas temperature sensors.

7. The gas supply system according to claim 1, wherein said monitoring system communicates with a central control room by electrical communication between the monitoring system and the control room.

8. A method of controlling a gas supply system comprising one or more pneumatic valves that control the supply of process gas to a process chamber, and one or more solenoid valves that open or close each of said pneumatic valves by supplying or stopping the flow of valve actuating gas to each of said pneumatic valves; and a gas supply control apparatus that controls the operation of the one or more solenoid valves; wherein said gas supply control apparatus further comprises:
a main controller that controls the actuation of the one or more solenoid valves during normal operation;
a sub-controller that senses an abnormal state of said main controller and upon sensing an abnormality, controls the actuation of said one or more solenoid valves instead of the main controller;
wherein said main controller and said sub-controller share digital sensing information through digital interfacing directly with each other, and the main controller and the sub-controller additionally share analog sensing information through analog interfacing directly with each other;
a monitoring system and a communication line;
wherein said monitoring system selectively communicates with said main controller and sub-controller to continuously monitor the process gas supply status; and
a changeover switch for interconnecting the main controller with the monitoring system through the communication line in the normal state and for interconnecting the sub-controller and the monitoring system through the communication line when the abnormality is detected, separately from the digital and analog interfacing between the main controller and the sub-controller.
said method comprising the steps of:
sharing digital, analog, or digital and analog, sensing information through digital, analog, or digital and analog, interfacing between said main controller and said sub-controller; and switching control of said gas supply system to said sub-controller that senses an abnormal state of said main controller; wherein said sub-controller controls the actuation of said one or more solenoid valves instead of the main controller.

9. The method of claim 8 further comprising the step of: maintaining the valve position of the one or more solenoid valves upon switching the control to the sub-controller.

10. The method of claim 8, further comprising the step of: activating one or more heaters by the sub-controller in response to process gas temperature information.

11. The method of claim 8, further comprising the step of: communicating a process gas supply status to a central control room.

12. The method of claim 8, further comprising the step of: communicating an emergency to a central control room when sensing information indicates that an unsafe level for any of the sensed information has been sensed.

13. The method of claim 8, further comprising the step of: shutting down the gas supply apparatus when any of the sensing information indicates that an unsafe level for any of the sensed information has been sensed.

* * * * *